United States Patent [19]

Baertsch et al.

[11] 4,446,532

[45] May 1, 1984

[54] SURFACE CHARGE SIGNAL PROCESSING APPARATUS

[75] Inventors: Richard D. Baertsch; William E. Engeler, both of Scotia, N.Y.

[73] Assignee: General Electric Company, Schenectady, N.Y.

[21] Appl. No.: 345,497

[22] Filed: Feb. 3, 1982

[51] Int. Cl.$^3$ ........................ G06G 7/19; G11C 11/40

[52] U.S. Cl. .................................... 364/824; 364/862; 357/24

[58] Field of Search .................... 364/824, 862; 357/24

[56] References Cited

U.S. PATENT DOCUMENTS

| | | | |
|---|---|---|---|
| 4,058,716 | 11/1977 | Goldberg | 364/824 |
| 4,058,717 | 11/1977 | Engeler | 364/824 |
| 4,084,257 | 4/1978 | Burke et al. | 364/862 |
| 4,403,299 | 9/1983 | Engeler | 364/824 |

OTHER PUBLICATIONS

R. F. Harland, AB 8182-Bit Shift Register, Proceedings of ISSCC, Feb. 14, 1973, pp. 54–55.

*Primary Examiner*—Jerry Smith
*Assistant Examiner*—Michael R. Fleming
*Attorney, Agent, or Firm*—Julius J. Zaskalicky; James C. Davis, Jr.; Marvin Snyder

[57] ABSTRACT

A plurality of charge storage cells, each including first and second storage regions and corresponding first and second electrodes insulatingly overlying the storage regions are provided in a semiconductor substrate. Means are provided for introducing into each of the first charge storage regions a respective quantity of charge proportional to a respective sample of an analog signal. Means are provided for developing a plurality of voltage waveforms, each of the waveforms including a series of periods, and each period constituted of first and second subperiods. Means are provided for applying each of the voltage waveforms to a respective one of the second electrodes of the cells. A high absolute level of a waveform applied to a second electrode of a cell causing charge in the first storage region thereof to transfer to the second storage region thereof and a low absolute level of the waveform applied to a second electrode of a cell causing charge in the second storage region thereof to transfer to the first storage region thereof. Each of the waveforms has a low absolute level during a first subperiod and an absolute level which is either high or low during a second subperiod in response to a respective reference signal, whereby charge in each cell is transferred between the first and second charge storage regions thereof in a time sequence determined by a respective reference signal. Means are provided connected in circuit with the first storage electrodes for sensing the total net charge transferred to and from the first charge storage regions during a common period of the voltage waveforms.

7 Claims, 26 Drawing Figures

MASTER CLOCK
FREQUENCY DIVIDER
WAVEFORM SYNTHESIZER
PILOT BIT
REF. WORD SOURCE
ANALOG SIGNAL SOURCE
WAVEFORM GENERATOR 22
1ST STAGE 61
2ND STAGE 62
3RD STAGE 63
1ST SUB-STAGE
2ND SUB-STAGE
1ST STAGE
2ND STAGE
3RD STAGE
SCANNER 20
DELAY CIRCUIT
SAMPLE HOLD GEN.
OUTPUT

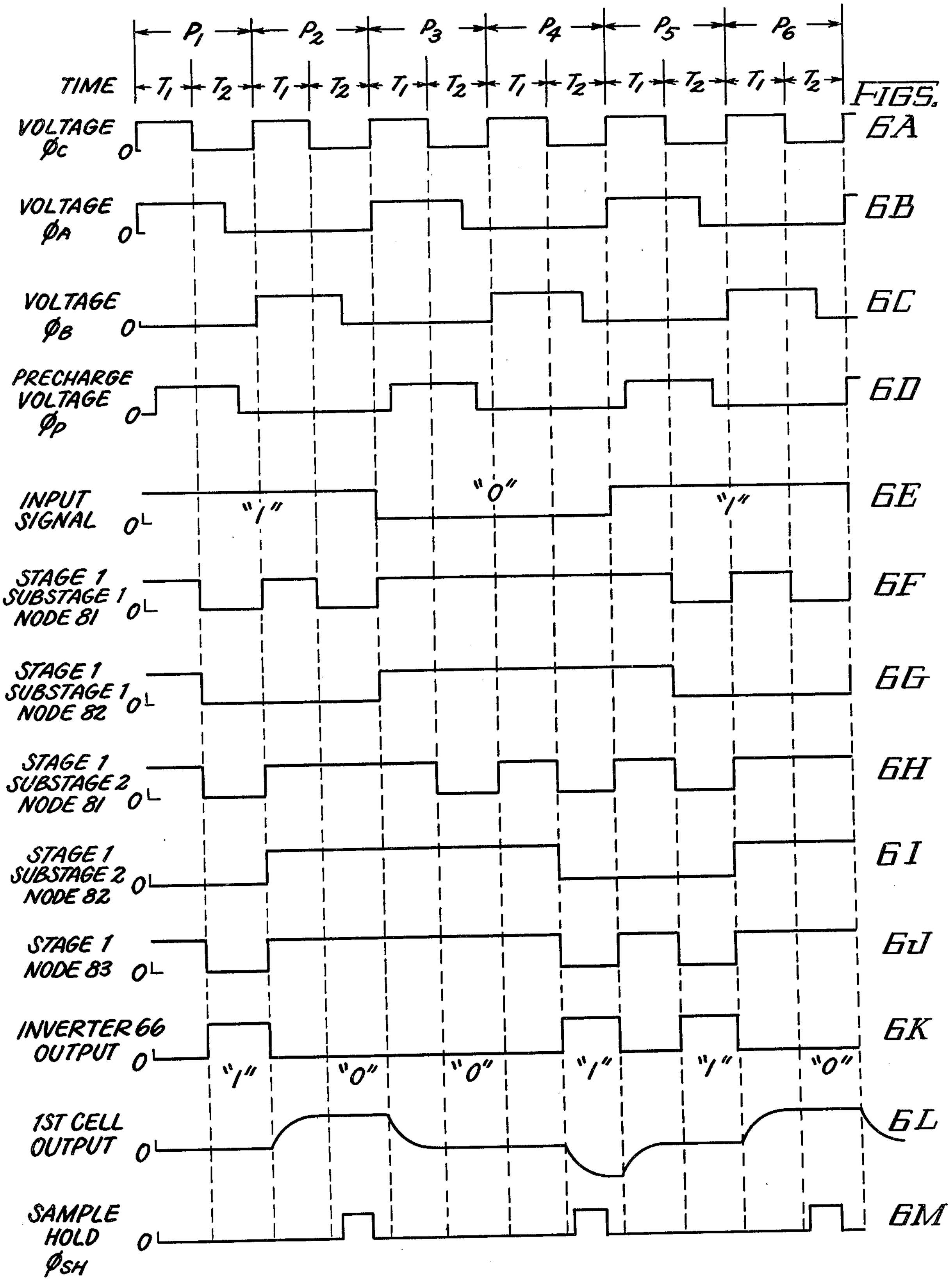
P1
P2
P3
P4
P5
P6
TIME
T1
T2
FIGS.
VOLTAGE ØC
6A
VOLTAGE ØA
6B
VOLTAGE ØB
6C
PRECHARGE VOLTAGE ØP
6D
INPUT SIGNAL
"1"
"0"
"1"
6E
STAGE 1 SUBSTAGE 1 NODE 81
6F
STAGE 1 SUBSTAGE 1 NODE 82
6G
STAGE 1 SUBSTAGE 2 NODE 81
6H
STAGE 1 SUBSTAGE 2 NODE 82
6I
STAGE 1 NODE 83
6J
INVERTER 66 OUTPUT
"1"
"0"
"0"
"1"
"1"
"0"
6K
1ST CELL OUTPUT
6L
SAMPLE HOLD ØSH
6M

SURFACE CHARGE SIGNAL PROCESSING APPARATUS

This invention relates in general to signal processing apparatus comprising charge transfer devices and in particular to such apparatus for obtaining the correlation between an analog signal and a digital reference word.

The invention of this application relates to improvements on the signal processing apparatus described and claimed in U.S. Pat. No. 4,058,717 assigned to the assignee of this invention and also in patent application Ser. No. 237,825, filed Feb. 25, 1981 assigned to the assignee of the present invention.

An object of this invention is to provide signal processing apparatus capable of multiplying a signal sample represented by a quantity of charge by +1 or −1.

Another object of this invention is to provide signal correlator apparatus using relatively simple surface charge cells and having a relatively simple cycle of operation.

Another object of this invention is to provide signal correlation apparatus which can include a very large number of surface charge cells yet operates at low power and relatively high speed.

A further object of this invention is to provide an organization of signal correlation apparatus which enables such apparatus including a large number of surface charge cells to be integrated in monolithic form.

In carrying out the invention in an illustrative embodiment thereof, there is provided a substrate of semiconductor material in which a plurality of charge storage cells are formed. Each cell includes a first charge storage region and also a second charge storage region adjacent a major surface of the substrate. The second charge storage region is separated from the first charge storage region by an intermediate region. A plurality of interconnected first electrodes are provided, each insulatingly overlying a respective first charge storage region. A plurality of second electrodes is also provided, each insulatingly overlying a respective second charge storage region.

A reference word having a series of successive elements is provided. A generating means having an input terminal and a plurality of output terminals is provided for developing a plurality of voltage waveforms each at a respective output terminal in response to said reference word applied to said input terminal. Each of said voltage waveforms includes a series of pairs of a first period and a succeeding second period, each period constituted of first and second subperiods. The first pair of successive first and second periods of the first of said voltage waveforms corresponding to the period of the first element of said reference word. Each succeeding pair of first and second periods of the said first voltage waveform corresponding to the period of a respective successive element of said reference word. The waveform of each one of said plurality of voltage waveforms at a respective output terminal being identical to the voltage waveform of a preceding voltage waveform at a preceding output terminal except delayed by the duration of a pair of first and second periods.

Means are provided for introducing into each of the first charge storage regions of successive ones of said cells during the first subperiod of a first period of a respective one of said voltage waveforms a respective one of successive quantities of charge, each quantity being proportional to a respective sample of a time-varying analog signal. Means are provided for applying each of said voltage waveforms to the second electrode of a respective one of said cells, a high absolute level of a voltage waveform applied to a second electrode of a cell causing charge in the first storage region thereof to transfer to the second storage region thereof and a low absolute level of said voltage waveform applied to a second electrode of a cell causing charge in the second storage region thereof to transfer to the first storage region thereof. Each of said voltage waveforms has a low absolute level during a first subperiod and an absolute level which is either high or low during a succeeding second subperiod in response to a respective element of said reference word. Thus, charge in each cell is transferred between said first and second charge storage regions thereof in a time sequence determined by a respective element of said reference word. Means are connected in circuit with said first storage electrodes for sensing the total net charge transferred to and from said first charge storage regions during a common period of said voltage waveforms.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

FIGS. 6A–6M are diagrams of amplitude versus time of voltages occurring at various points in the apparatus of FIG. 1.

Figure 1:
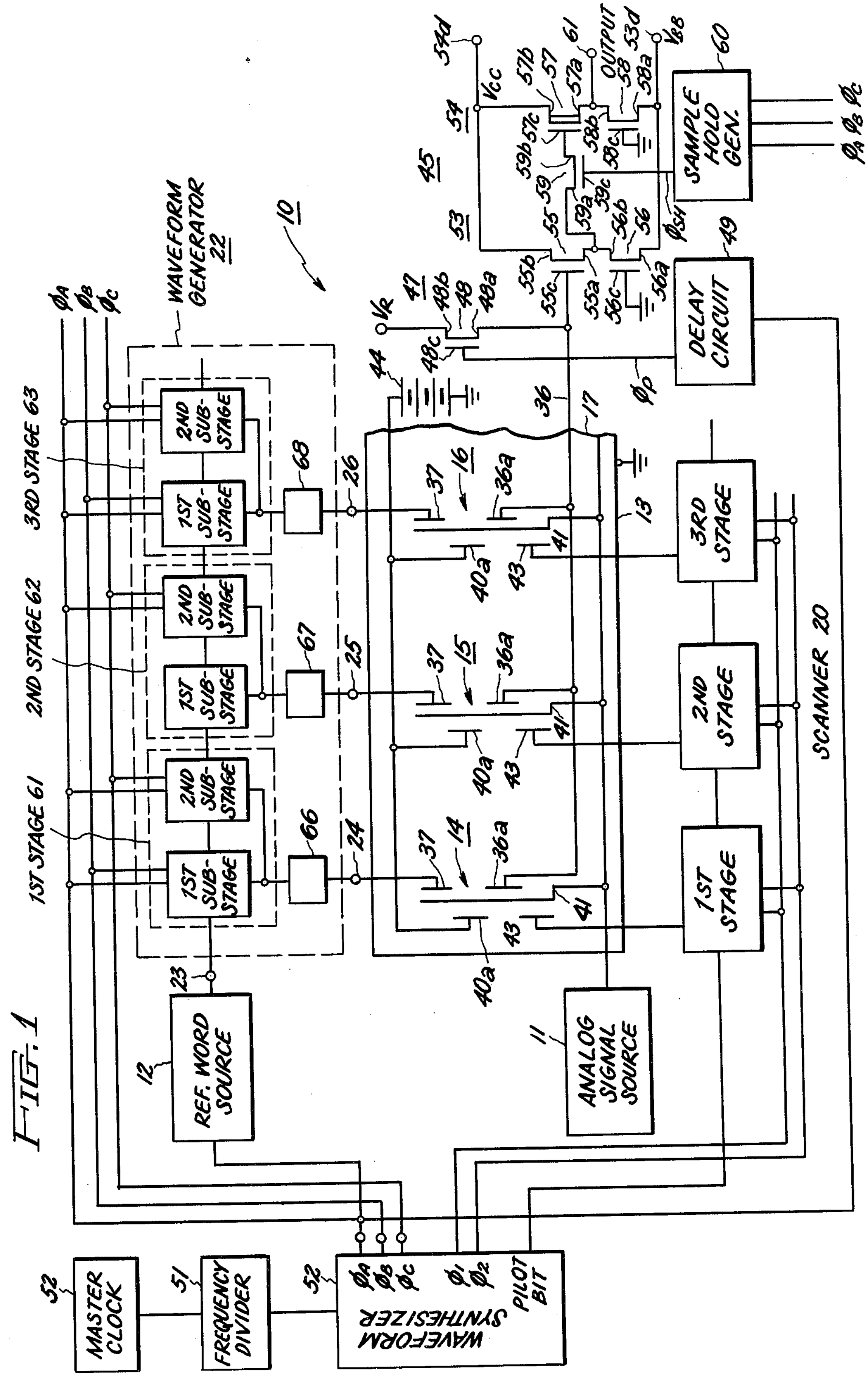
FIG. 1 is a block diagram of surface charge signal correlation apparatus in accordance with an embodiment of the present invention.

Reference is now made to FIG. 1 which shows surface charge signal correlation apparatus 10 for providing the correlation between a time varying analog signal from a source 11 and a reference word from source 12. The reference word may be in the form of a PN sequence, for example. A PN sequence is a sequence of the values of +1 and −1 and may be represented by a digital sequence having values of 1 or 0, where the 1 corresponds to a positive element and the 0 corresponds to a negative element.

The apparatus 10 includes an assembly 13 of a plurality of charge transfer devices 14, 15 and 16 formed on a common substrate 17, only three of which are shown for reasons of simplicity in describing the apparatus and explaining the operation thereof. The apparatus also includes a multistage scanner 20, each stage of which is operatively associated with a respective charge transfer device for sequentially gating samples of the analog signal into the charge transfer devices. A voltage waveform generator 22 is provided having an input terminal 23 and a plurality of output terminals, only the first three terminals 24, 25 and 26 of which are shown. The waveform generator 22 converts a digital sequence having values of 1 to 0 applied to the input terminal 23 into a Manchester Code sequence at each of the output terminals 24,25, 26, successively delayed. In a Manchester Code each bit is represented by two successive bits, a 1 bit of the digital word, corresponding to positive element of the sequence, is represented by a 1 followed by a 0, and 0 bit of the digital word, corresponding to the negative element of the sequence, is represented by a 0 followed by a 1. The reference word or digital sequence format is applied to the input terminal 23 of the waveform generator 22 and at each of the output terminals 24, 25 and 26 of the waveform generator 24 is obtained a respective voltage waveform in Manchester Code format for controlling the signal processing in a respective one of charge transfer devices 14–16.

Figure 3:
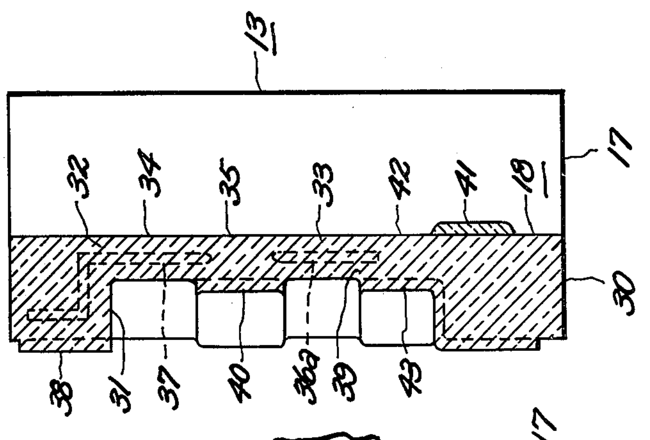
FIG. 3 is a sectional view of the assembly of FIG. 2 taken along section lines 3—3 thereof.
Figure 2:
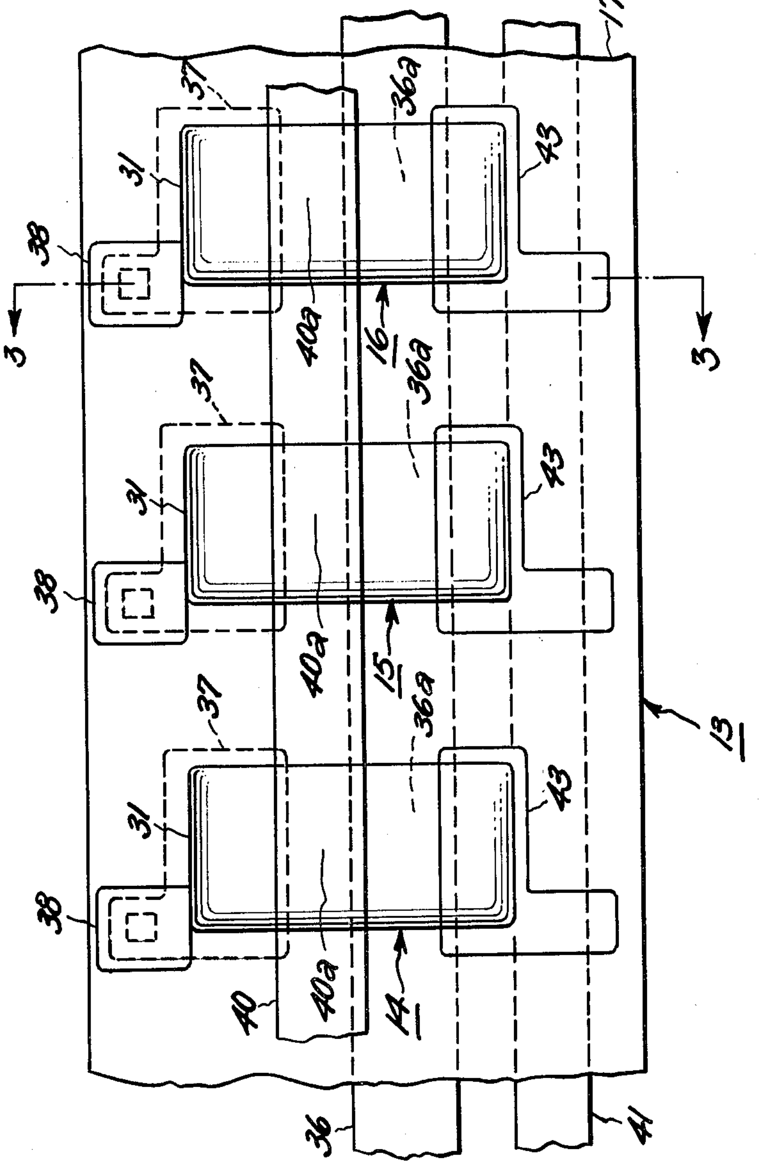
FIG. 2 is a plan view of an assembly of several charge storage cells of the surface chrage signal correlation apparatus of FIG. 1 integrated on a single substrate.

As shown in FIGS. 2 and 3, the devices 14–16 are formed on a common substrate 17 of, for example P-type conductivity silicon of a suitable resistivity, for example 10 ohm-cm. The substrate is provided with a major surface 18. A layer 30 of thick insulating material, which may conveniently be silicon dioxide, is provided overlying the major surface 18. A plurality of generally rectangular recesses 31 are provided in the thick insulating member 30 each recess corresponding to the location of a respective charge transfer device or cell. Each of the recesses 31 extends to within a short distance of the major surface of the semiconductor substrate to provide a region of thin insulation 32 lying over the substrate and defining a charge transfer cell therein. Each of the charge transfer cells 14–16 includes a first charge storage region 33 and a second charge storage region 34 spaced from the first charge storage region and defining a respective first intermediate region 35 therebetween, all adjacent the major surface 18. Overlying the thick and thin portions of the insulating member 30 and extending generally perpendicular to the long dimension of the receses 31 is a conductive member or line 36. The portions of the conducting member 36 lying in the recesses constitute a first plurality of first electrodes 36a, each electrode overlying a respective first storage region 33 of a charge transfer device or cell. A plurality of second electrodes 37 are provided, each electrode in a respective recess and each overlying a respective second charge storage region 34 in the charge transfer cells. Terminals 38 provide electrical connection to the electrodes 37. A second layer 39 of thin insulation is provided in each of the recesses 31. Overlying the thick and thin portions of the insulating member and extending generally perpendicular to the long dimension of the recesses 31 is a conductive member or line 40. The portions of the conductive member 40 lying in the recesses constitute a plurality of first gating electrodes 40a each overlying a respective intermediate region 35. Also provided in the semiconductor substrate is a region 41 of N-type conductivity spaced from the first charge storage regions 33 of each of the cells and defining a respective second intermediate region 42 therebetween. A plurality of second gating electrodes 43 are provided each in a respective recess and each overlying a respective second intermediate region 42.

Referring now particularly to FIG. 1, the first gating electrodes 40a of each of the devices 14–16 are connected to the positive terminal of a source 44 of potential, the negative terminal of which is connected to ground to establish a surface potential in each of the first intermediate regions 35 of a fixed value. Each of the first storage electrodes 36a of each of the devices 14–16 are interconnected by the line 36 which is connected to the input terminal of the output circuit 45, shown as gate 55c of transistor 55. In the operation of the apparatus it is necessary to reset the line 36 to a fixed potential for one period of time and to allow this electrode to float during another period of time. The fixed potential on line 36 is set to provide a surface potential in the first storage regions which is less in absolute magnitude than the fixed value of surface potential on intermediate region 35 underlying stationary gate 40. To this end a reset circuit 47 is provided including a transistor 48 having a source 48a, a drain 48b and a gate 48c. The source 48a is connected to the line 36, the drain 48b is connected to a source of reset potential $V_R$ and the gate 48c is connected to a delay circuit 49 of the input of which is the $\phi_A$ waveform. The delay circuit 49 is a driver which delays the $\phi_A$ waveform by a fixed interval as shown in FIG. 6D. The region 41 of opposite conductivity type is connected to the analog signal source 11. Each of the second gating electrodes 43 is connected to a respective stage of the scanner 20. In response to a pilot bit applied to the scanner 20 from a waveform synthesizer 50, a pulse is applied to each of the second gating electrodes 43 in sequence during the first subperiod $T_1$ of the odd periods ($P_1$, $P_3$, $P_5$) and the $\phi_C$ voltage to sample the analog signal appearing on the region 41 and transfer into each of the first storage regions 33 of the devices in sequence a respective quantity of charge proportional to a respective sample of the analog signal, as will be explained in more detail below. The waveforms $\phi_C$, $\phi_A$ and $\phi_B$ used for driving the waveform generator 22 are obtained from the waveform synthesizer 50. The waveform $\phi_A$ is also used for synchronizing the reference word source 12. The waveforms $\phi_C$, $\phi_A$ and $\phi_B$ are shown in FIGS. 6A–6C, respectively, and will be described in more detail below. A cycle of waveforms $\phi_A$ and $\phi_B$ have twice the period of a cycle of waveform $\phi_C$. The waveform synthesizer 50 also supplies a pair of phased pulse voltages $\phi_1$ and $\phi_2$ (not shown) of twice the period of the $\phi_A$ voltage for driving the scanner 20. The waveform synthesizer in addition supplies a pilot bit (not shown) which is applied to the scanner 20 and shifted from stage to stage thereof at the periodicity of the $\phi_A$ waveform as will be described below. The inputs to waveform synthesizer 50 is obtained from frequency divider 51 which is driven from master clock 52 which provides an output frequency which is eight times the frequency of the waveform $\phi_C$.

In response to a reference word or digital sequence applied to the input of waveform generator 22, the waveform generator 22 develops a plurality of voltage waveforms at the output terminals 24–26 thereof. A first voltage waveform is developed at terminal 24, a second voltage waveform is developed at output terminal 25, a third voltage waveform is developed at output terminal 26 and so on. The second waveform is identical to the first voltage waveform except that is delayed by two master clock cycles of the waveform $\phi_C$. The third voltage waveform is identical to the first voltage waveform except that it is delayed by four cycles of the waveform $\phi_C$. Each of the waveforms includes a series of periods, each period including a first subperiod and a second subperiod. In response to a reference bit of one value aforementioned, a voltage waveform consisting of two periods is developed at the output terminal 24. The voltage waveform has a low level during the first subperiod of the first period and a high level during the second subperiod of the first period and has low levels during the first and second subperiods of the second period. In response to the bit of the other value aforementioned, another voltage waveform consisting of two periods is developed. During the first and second subperiods of the first period, the voltage waveform has a low level. During the first subperiod of the second period the voltage waveform has a low level. During the second subperiod of the second period the voltage waveform has a high level. A high absolute level of the voltage waveform applied to a second electrode of a cell such as cell 14 causes charge in the first storage region 33 thereof to transfer to the second storage region 34 thereof and a low absolute level of the voltage applied to the second electrode of a cell causes charge in the second storage region 34 thereof to transfer to the first storage region 33 thereof.

Thus, when the waveform which has been developed in response to a one bit is applied to a second electrode of a cell, charge is contained in the first storage region thereof during the first subperiod of the first period, is transferred to the second storage region thereof during a second subperiod of the first period. During the first subperiod of the second period, charge is returned to the first storage region thereof as the potential of the second electrode is lowered and remains in the first storage region thereof during the second subperiod of the second period. When the voltage waveform developed in response to a zero bit is applied to the second electrode, charge is contained in the first storage region thereof during the first subperiod of the first period, remains in the first storage region during the second subperiod of the first period and during the first subperiod of the second period, and is transferred to the second storage region thereof during the second subperiod of the second period as the potential on the second electrode is lowered at this time.

During portions of the first and second subperiods of the first period of the voltage waveform $\phi_C$ the line 36 and the first electrodes 36a to which line 36 is connected are maintained at a preset value by activation of preset circuit 47. During the first and second subperiods of the second period, the preset circuit 47 is inactivated and the electrodes 36a are allowed to float. During the second period of the waveform $\phi_C$ charge is transferred into and out of a first storage region of a cell resulting in a net charge transfer into or our of the first storage regions thereby producing a change in voltage on the line 36 which is measure of this net charge transfer. At the output of output circuit 45, a net change in voltage is obtained which represents this net transfer of charge and represents a correlation output.

The output circuit 45 comprises a first stage 53 and a second stage 54 of amplification. The first stage 53 includes transistor 55 having a source 55a, a drain 55b and a gate 55c and a transistor 56 including a source 56a, a drain 56b and a gate 56c. Drain 55b is connected to terminal 53d which provides drain potential $V_{CC}$. The source 55a is connected to the drain 56b of transistor 56 and the source 56a is connected to terminal 54d which provides source potential $V_{BB}$. The gate 55c is connected to line 36. The gate 56c is connected to ground.

The second stage 54 includes a depletion mode transistor 57 having a source 57a, a drain 57b and a gate 57c and a second transistor 58 having a source 58a, a drain 58b and a gate 58c. Drain 57b is connected to terminal 54d. The source 57a is connected to the drain 58b. The source 58a is connected to terminal 53d. Gate 58c is connected to ground. A sample and hold switch in the form of transistor 59 having a source 59a, a drain 59b and a gate 59c has its source-drain conduction path connected between source 55a of transistor 55 and gate 57c of transistor 57. Gate 59c of transistor 59 is connected to the output of sample and hold generator 60 which provides an output $V_{SH}$ as shown in FIG. 6M in response to a logical combination of the $\phi_A$, $\phi_B$ and $\phi_C$ waveforms obtained from waveform synthesizer 50. As shown in FIG. 6M, the sample and hold switch is operative during the second subperiod of the second period of a cycle of operation to provide a correlation output at output terminal 61 connected to source 57a of transistor 57. Preferably the output circuit 45 and the preset circuit 47 are formed on the same semiconductor substrate as semiconductor substrate 17 on which devices 14, 15, and 16 are formed.

Figure 4:
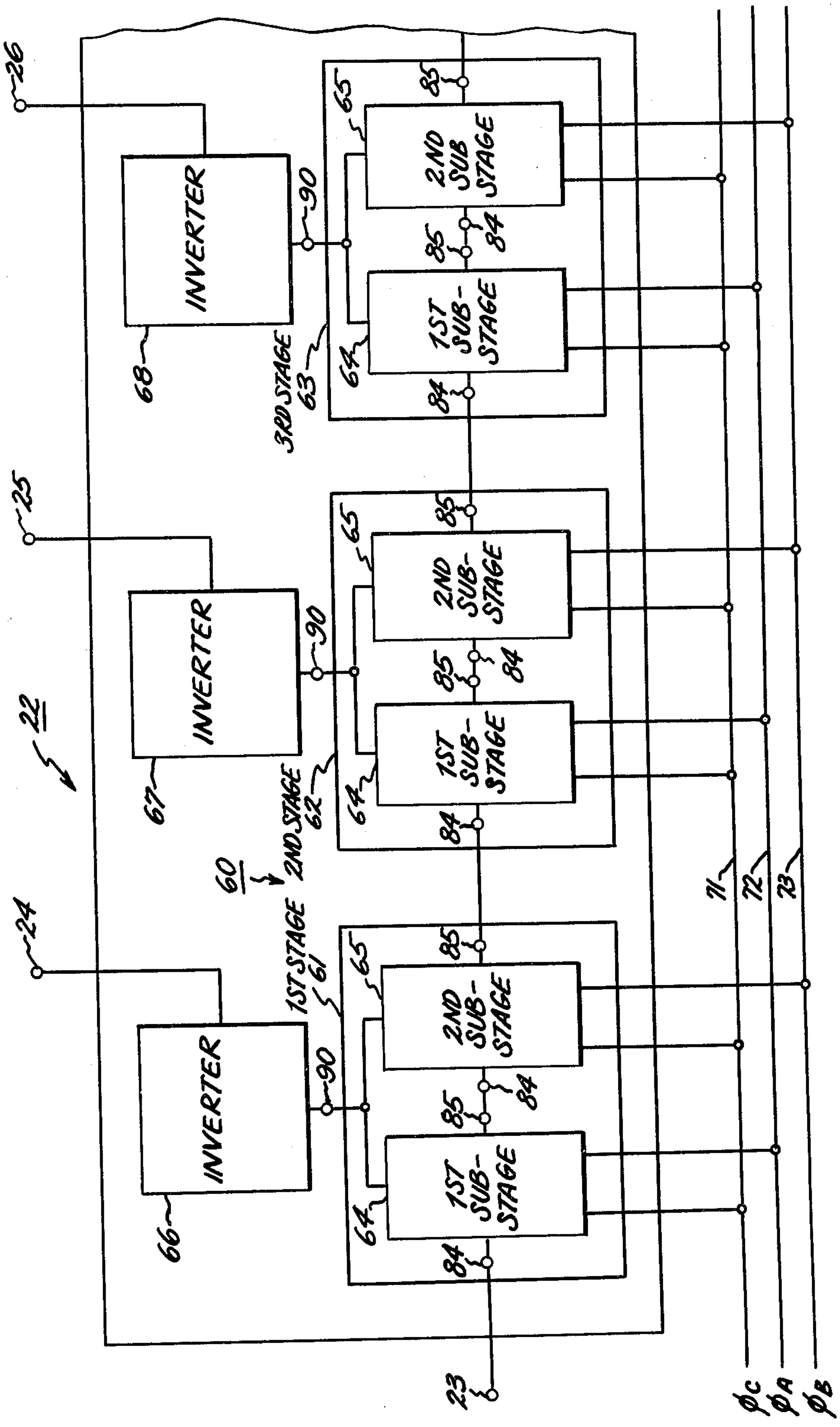
FIG. 4 is a block diagram of the waveform generation apparatus of FIG. 1.

Reference is now made to FIG. 4 which shows waveform generator 22 for converting a reference word of binary bits, in which a first level corresponds to one bit and a second level corresponds to the other bit, into outputs in Manchester Code of the character described above. Waveform generator 22 includes an input terminal 23 and a plurality of output terminals only three terminals 24, 25 and 26 of which are shown. The waveform generator 22 comprises a shift register 60 including a plurality of stages, only three stages, 61, 62 and 63 of which are shown. Each of the stages 61, 62 and 63 includes a first substage 64 and a second substage 65. The first and second substages 64 and 65 are identical and each has an input terminal 84 and an output terminal 85. The input terminal 84 of the first substage 64 of a stage constitutes the input terminal 84 of the stage. The output terminal 85 of the first substage 64 is connected to the input terminal 84 of the second substage 65. The output terminal 85 of the second substage 65 constitutes the output terminal 85 of the stage. The input terminal 84 of the first stage 61 is connected to the input terminal 23 of the waveform generator 22. Three lines 71, 72 and 73 are provided on which the voltages $\phi_C$, $\phi_A$ and $\phi_B$, shown in FIGS. 6A–6C, respectively, are provided for driving the waveform generator 22. The waveform generator 22 also includes a plurality of inverters only three inverters 66, 67 and 68 of which are shown. Each inverter has an input terminal 90 connected to an output node of a respective stage of the shift register and has an output terminal connected to a respective output terminal of the waveform generator 22. Preferably the waveform generator 22 including the shift register 60 and the inverters 66–68 are formed on the same semiconductor substrate 17 on which devices 14, 15 and 16 are formed.

Figure 5:
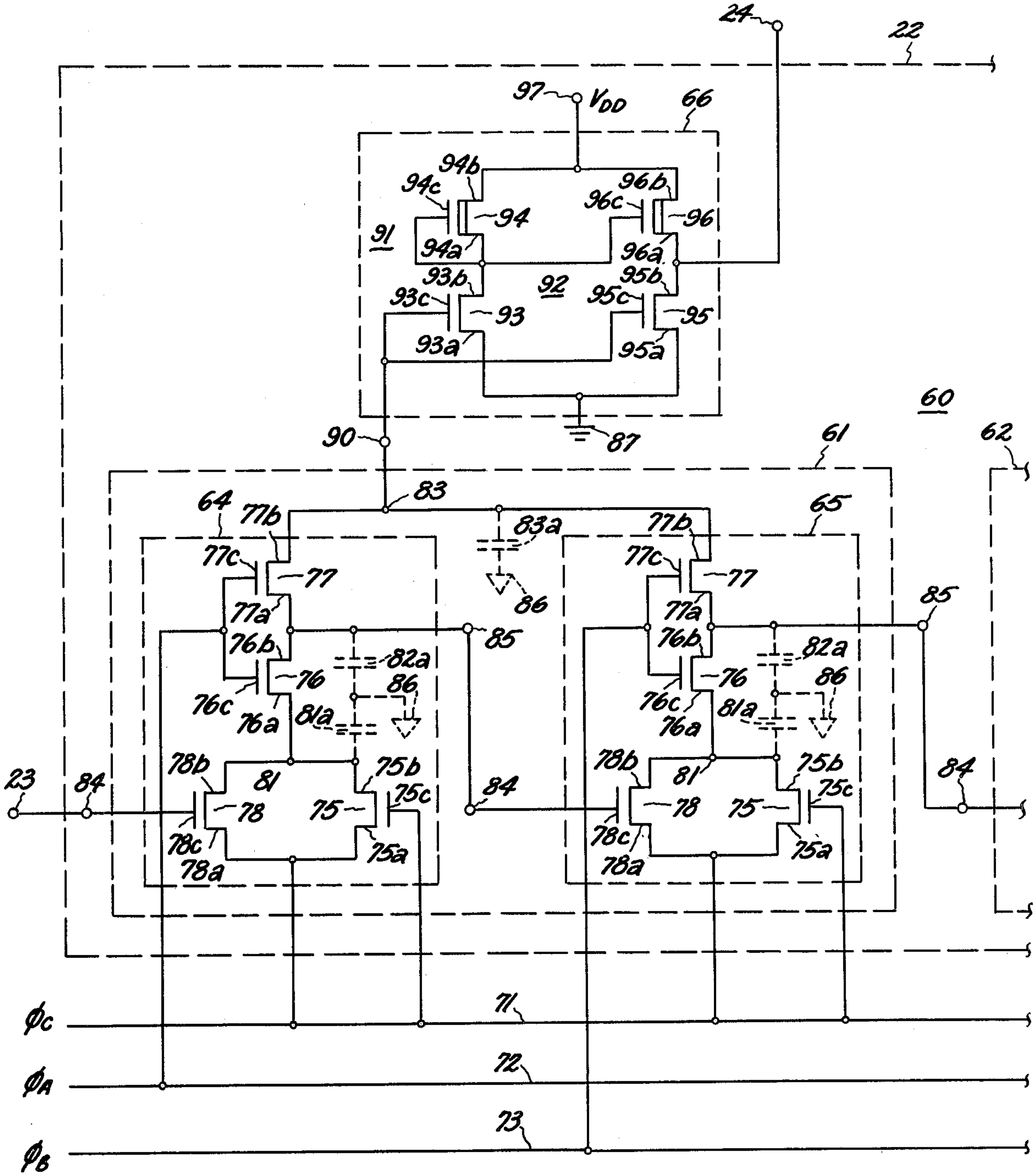
FIG. 5 is a schematic of the first stage of the voltage waveform generation apparatus of FIG. 4.

Reference is now made to FIG. 5 which shows a schematic diagram of the first stage 61 of the waveform generator 22 including a first substage 64 and a second substage 65. Each of the substages 64 and 65 includes a first transistor 75 having a source 75*a*, a drain 75*b* and a gate 75*c*, a second transistor 76 having a source 76*a*, a drain 76*b* and a gate 76*c*, a third transistor 77 having a source 77*a*, a drain 77*b* and a gate 77*c* and a fourth transistor 78 having a source 78*a*, a drain 78*b* and a gate 78*c*. The source 75*a* of the first transistor is connected to line 71. The drain 75*b* is connected to source 76*a* forming therewith a first nodal point 81. The capacitance of the source 76*a* and the drain 75*b* with respect to substrate is indicated by dotted capacitance 81*a* connected between the nodal point 81 and the substrate 86. The drain 76*b* is connected to the source 77*a* and constitutes second nodal point 82. The drain 76*b* and the source 77*a* form a capacitance with respect to substrate indicated by dotted capacitor 82*a* connected between second nodal point 82 and substrate 86. The drains 77*b* of the transistor 77 of the first and second stages 64 and 65 are connected together and constitute nodal point 83. The drains 77*b* of the first and second substages form a capacitance with respect to the substrate, shown as nodal capacitance 83*a* connected between the nodal point 83 and the substrate 86. The source 75*a* and gate 75*c* of the first transistor 75 of each of the substages 64 and 65 are connected to line 71 to which $\phi_C$ voltage is applied. The gates 76*c* and 77*c* of the second and third transistors 76 and 77 are connected to line 72 to which $\phi_A$ voltage is applied. The gates 76*c* and 77*c* of the second and third transistors of the second substage 65 are connected to the line 73 to which $\phi_B$ voltage is applied. The gate 78*c* of the fourth transistor of the first substage of the first stage is connected to the input terminal 84 of the first substage and constitutes the input terminal 84 of the stage as well. The nodal point 82 of the first substage constitutes the output terminal 85 of the substage and is connected to the gate 78*c* of the fourth transistor 78 of the second substage constituting the input terminal 84 of the substage. The nodal point 82 of the second substage of the stage constitutes the output terminal 85 on the substage and also the output terminal 85 of the stage, referred to as the first output terminal of the stage. The input terminal 84 of the first stage is connected to the input terminal 23 of the waveform generator 22. The first output terminal 85 of the first stage 61 is connected to the input terminal 84 of the second stage 62. The first output terminal 85 of the second stage 62 is connected to the input terminal 84 of the third stage 63 and so on.

Consider now the operation of the first stage 61 of the shift register 60 of FIG. 5, referring to the waveform diagrams of FIGS. 6A–6M as well. Consider in particular the operation of the first substage 64 of the first stage 61 over two periods $P_1$ and $P_2$ of the $\phi_C$ voltage. $\phi_C$ voltage is applied to the gate 75*c*, $\phi_A$ voltage is applied to gates 76*c* and 77*c*, and a high level corresponding to a "1" of the input signal is applied to input terminal 84 and gate 78*c* of the first substage. During subperiod $T_1$ of period $P_1$ nodal capacitors 81*a* and 82*a* are charged to their high levels as the $\phi_C$ voltage is high. During subperiod $T_2$ of period $P_1$, the $\phi_C$ voltage is at its low level while the $\phi_A$ voltage continues at its high level for part of the subperiod $T_2$. Thus, first node capacitor 81*a* discharges through transistor 78 at the end of subperiod $T_1$, and remain discharged during subperiod $T_2$, and also the second node capacitors 82*a* discharges through transistor 78 at the end of subperiod $T_1$ and remain discharged through subperiod $T_2$. During subperiod $T_1$ of period $P_2$ of the $\phi_C$ voltage the node capacitor 81*a* is charged to its high level and during subperiod $T_2$ it is discharged to its low level. During the period $P_2$ the nodal capacitor 82*a* remains at its low level as $\phi_A$ voltage is at its low level during period $P_2$. Thus, in response to a high level or a "1" being applied to gate 78*c* of the fourth transistor 78 during the periods $P_1$ and $P_2$, a low level or a "0" level appears at node point 82 (FIG. 6A) and output terminal 85 of the first substage during the subperiod $T_2$ of period $P_1$ and also during period $P_2$.

Consider now the operation of the first substage 64 of the first stage 61 during periods $P_3$ and $P_4$ of the $\phi_C$ voltage when a low level or "0" level is applied to gate 78*c*. During subperiod $T_1$ of period $P_3$ the nodal capacitors 81*a* and 82*a* are charged to their high levels and are maintained at their high levels during periods $P_3$ and $P_4$ as the gate 78*c* of the fourth transistor 78 is turned off during periods $P_3$ and $P_4$. Thus, in response to a low level or a "0" being applied to the gate 78*c* of transistor 78 during the periods $P_3$ and $P_4$, a high level or a "1" level appears at node point 82 (FIG. 6G) during periods $P_3$ and $P_4$. For periods $P_5$ and $P_6$ of $\phi_C$ voltage, when a "1" level is again applied to gate 78*c* of the fourth transistor 78 the voltage levels of the nodal points 81 and 82 are identical to the levels of these nodal points during the periods $P_1$ and $P_2$ of the $\phi_C$ voltage.

Consider now the operation of the second substage 65 of the first stage 61 over the periods $P_1$ and $P_2$ of the $\phi_C$ voltage. $\phi_C$ voltage is applied to gate 75*c*, $\phi_B$ voltage is applied to gates 76*c* and 77*c*, and the voltage on node point 82 of the first substage 64 or output terminal 85 is applied to gate 78*c*. During the subperiod $T_1$ of period $P_1$ nodal capacitor 81*a* is charged to its high level as the $\phi_C$ voltage level is high. During subperiod $T_2$ of period $P_1$, the $\phi_C$ voltage is at its low level and the nodal capacitance 81*a* is discharged to its low level. During the period $P_1$ the $\phi_B$ voltage is at its low level and the nodal capacitor 82*a* remains uncharged. During the subperiod $T_1$ of period $P_2$ the $\phi_C$ and $\phi_B$ voltages are at their high levels thereby charging nodal capacitors 81*a* and 82*a* to their high levels. During the subperiod $T_2$ of period $P_2$, the level of the node point 82 of the first substage applied to gate 78*c* of the second substage is low thereby nodal points 81 and 82 (FIGS. 6H and 6I) maintain their high level during the subperiod $T_2$ of period $P_2$.

Consider now the operation of the second substage 85 of the first stage 61 during periods $P_3$ and $P_4$ of the $\phi_C$ voltage. During periods $P_3$ and $P_4$ the level at the output node 82 of the first substages and hence at the gate 78*c* of the second substage is high. During the subperiod $T_1$ of period $P_3$ the nodal capacitor 81*a* is charged to its high level and during the subperiod $T_2$ of period $P_3$ the nodal capacitor 81*a* is discharged to its low level. During the period $P_3$ the nodal capacitor 82*a* (FIG. 5I) remains at its high level as $\phi_B$ voltage is low. During the subperiod $T_1$ of period $P_4$ the nodal capacitor 81 is charged to its high level and during the subperiod $T_2$ of period $P_4$ the nodal capacitor **81*a* is discharged to its low level. During the subperiod $T_1$ of period $P_4$ capacitor 82*a* maintains its charge at high level and during subperiod $T_2$ of period $P_4$ it is discharged to its low level as $\phi_B$ voltage applied to gate 76*c* is high. For the periods $P_5$ and $P_6$ of the $\phi_C$ voltage when the voltage applied to input terminal 84 or gate 78*c* of the second substage 64 is the same as the input voltage applied to this input terminal during periods $P_1$ and $P_2$. Thus, the levels at the nodal points 81 and 82 (FIGS. 6H and 6I**) are identical to the levels of the nodal points during the periods $P_1$ and $P_2$ of the $\phi_C$ voltage.

The output of the first stage 61 appears at the output terminal 85 thereof connected to nodal point 82 of the second substage 65 and is referred to as the first output thereof. The first output is shown in FIG. 6I and is applied to the input terminal 84 of the second stage 62. The nodal capacitor **82*a* of the first substage of the second stage is charged during the first subperiod $T_1$ of period $P_3$ and discharged during the second subperiod $T_2$ of period $P_3$ as the input terminal 84 is high during period $P_3$ and is identical to charging of the nodal capacitor 82*a* of the first substage of the first stage during period $P_1$. The state of charge of nodal capacitor 82*a* of the second substage of the second state 62 during the period $P_4$ is identical to the stage of charge of the nodal capacitor 82*a* of the second substage of the first stage during period $P_2$. Thus the "1" of the input signal at the input terminal 84 of the first stage 61 during the period $P_1$ appears as a "1" at the output terminal 85 thereof during period $P_3$, delayed by two cycles of the $\phi_C$ voltage. Similarly, the "0" of the appearing at the input terminal of the first stage 61 during the period $P_3$ appears as a "0" at the output terminal 85 thereof delayed by two cycles of the $\phi_C$ voltage. The first output of the second stage on terminal 85 is applied to the input terminal 84 of the third stage 63 and at the output terminal 85 thereof a first output is obtained identical to the first output of the first stage delayed 61** by four cycles of the $\phi_C$ voltage.

Consider now the output developed at the output terminal 83 of the first stage 61, now referred to as the second output terminal of the stage. During the first subperiod $T_1$ of period $P_1$ nodal capacitor **83*a* is charged through the first substage 64 as the $\phi_C$ voltage and the $\phi_A$ voltage are high. During the second subperiod $T_2$ of period $P_1$, the nodal capacitor 83*a* is discharged as the $\phi_C$ voltage goes to its low level while $\phi_A$ voltage and the input signal are high. During subperiod $T_1$ of period $P_2$, nodal capacitor 83*a* is charged through the second substage 65, as $\phi_C$ voltage is high and the $\phi_B$ voltage is high. During the second subperiod $T_2$ of period $P_2$ the nodal capacitor 83*a* remains charged as the voltage applied to the input terminal 84 of the second substage 65 is low. During the period $P_3$ nodal capacitor 83*a* remains charged as turning on of the first substage 65 by a high level of $\phi_C$ voltage tends to charge nodal capacitor 83*a* and it cannot be discharged as the input signal is at a low level. During the first subperiod $T_1$ of period $P_4$ the nodal capacitor 83*a* remains charged as turning on the second substage 65 by $\phi_C$ voltage and $\phi_B$ voltage would tend to charge nodal capacitor 83*a*. During the second subperiod $T_2$ of period $P_4$, nodal capacitor 83*a* is discharged as $\phi_B$ voltage is high and the voltage at input terminal 84 of the second substage 65 is high. During the periods $P_5$ and $P_6$ the state of charge on nodal capacitor 83*a* is the same as the state of charge during the periods $P_1$ and $P_2$. Thus, the output voltage appearing at the output terminal 83 of the first stage, referred to as the second output terminal of the stage, is as shown in FIG. 6J. The second output at output terminal 83 of the second stage 62 during periods $P_3$ and $P_4$ is identical to the second output obtained at output terminal 83 of the first stage 61 during periods $P_1$ and $P_2$ for reasons set forth above. Similarly, the second output obtained from the output terminal 83 of the third stage 63 during periods $P_5$ and $P_6$ is identical to the second output obtained at the output terminal 83 of the first stage during periods $P_1$ and $P_2$. Thus, the outputs obtained at the output terminals 83, referred to as second output terminals, of stages 62 and 63 are the same as the output obtained at the second output terminal 83** of the first stage, except delayed by two and four cycles of a $\phi_C$ voltage, respectively.

The output from the first stage 61 appearing at the output point 83 is applied to the input terminal 90 of the inverter 66 and appears as an inverted output at output terminal 24 thereof. The input terminals 90 of inverters 67 and 68 are connected to the output points 83 of the second and third shift stages 62 and 63, respectively, and outputs are obtained at output terminals 25 and 26, of the inverters 67 and 68.

Inverter 66 comprises a first stage 91 and a second stage 92. The first stage 91 includes an enhancement mode transistor 93 having a source **93*a*, a drain 93*b* and a gate 93*c* and a depletion mode transistor 94 having a source 94*a*, a drain 94*b* and a gate 94*c*. The source 93*a* is connected to ground 87. The drain 93*b* is connected to the source 94*a* and the drain 94*b* is connected to a terminal 97 to which operating potential $V_{DD}$ is applied. The gate 93*c* is connected to input terminal 90 and the gate 94*c* is connected to the source 94*a*. The second stage 92 of the inverter 66 includes an enhancement mode transistor 95 having a source 95*a*, a drain 95*b* and a gate 95*c* and a depletion mode transistor 96 having a source 96*a*, a drain 96*b* and a gate 96*c*. Source 95*a* is connected to ground 87, the drain 95*b* is connected to source 96*a* and to output terminal 24. The drain 96*b* is connected to terminal 97. The gate 95*c* is connected to input terminal 90 and the gate 96*c* is connected to the source 94*a***.

In operation, when the input terminal 90 is at a high level, transistor 93 and transistor 95 are turned ON causing the drain **93*b* to drop to its low level. Accordingly, terminal 24 is connected through the conducting path of transistor 95 to ground and thus is at low level. When terminal 90 is driven to a low level, transistors 93 and 95 are turned off. Drain 93*b* rises very rapidly toward potential $V_{DD}$ because of the turn off of transistor 93 and the current flow in depletion mode transistor 94. Drain 95*b* also rises very rapidly toward potential $V_{DD}$ because of the turn off of transistor 95 and the enhanced current flow in depletion mode transistor 96 produced by the potential of gate 96*c* thereof moving toward $V_{DD}$. The resistance-capacitance time constants of the circuit elements are arranged to provide a fast charging rate of the capacitance at the output terminal 24. Thus, in response to a voltage wave, such as shown in FIG. 6J, applied to input terminal 90 of the inverter of the first stage, an output, such as shown in FIG. 6K, is obtained at the output terminal 24** thereof.

The operation of the correlator apparatus of FIG. 1 will now be described in connection with the waveform diagrams of FIGS. 6A, 6D, 6K, 6L and 6M and also in connection with the surface potential diagrams of FIGS. 7A–7D and FIGS. 8A–8D. The operation will be described in connection with the application of a reference word consisting of successive bits of "1", "0" and "1" occurring over six clock cycles, $P_1$–$P_6$, of the voltage waveform $\phi_c$.

As mentioned above, FIG. 6A shows the voltage $\phi_c$ represents the basic clocking frequency of the waveform generation apparatus 22, a period P of which is constituted of two equal subperiods $T_1$ and $T_2$.

FIG. 6D shows the precharge waveform $\phi_p$ obtained at the output of the delay circuit 49 for functioning a preset circuit 47 for presetting the output line 36 of FIG. 1.

FIG. 6E shows the reference word consisting of successive bits of "1", "0" and "1", each bit occurring over a period P consisting of two subperiods $T_1$ and $T_2$.

FIG. 6K shows the output appearing at output terminal 24 of the first stage of the waveform generator 22.

FIG. 6L shows the voltage appearing on the output line 36 of FIG. 1 in response to the introduction of a sample of an analog signal into the first storage region of the first cell and in response to the application of a voltage waveform of FIG. 6K to the second electrode thereof causing the cycling of the charge in the cell.

FIG. 6M shows sampling voltage $\phi_{SH}$ applied to sampling switch 59 for sampling valid correlation outputs during the second subperiods of the even periods of a sequence of periods $P_1$–$P_6$ and providing outputs at output terminals 61 thereof.

With the apparatus operating under the control of the master clock 52, an analog signal is supplied to the N-type region 41 from analog signal source 11. A pilot or scan bit is applied to the first stage of the scanner 20 from the waveform synthesizer 50 and is clocked from stage to stage of the scanner. The bits of the reference word from reference source 21 are synchronized with a waveform $\phi_A$, have twice the period of waveform $\phi_C$, obtained from waveform synthesizer 50 and are applied to the input terminal 23 of the waveform generator 22.

Figure 7A:
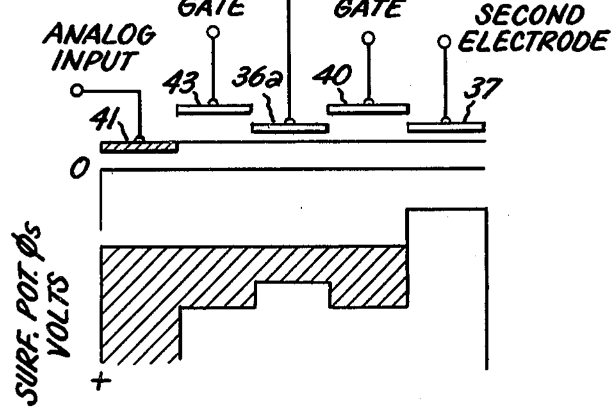
FIG. 7A shows a sectional view of a charge storage cell of the apparatus of FIG. 1 and also includes a diagram of semiconductor surface potential versus distance along the semiconductor surface during a first subperiod of a first period of a voltage waveform produced in response to a reference signal and applied to the second electrode of the cell.
Figure 7B:
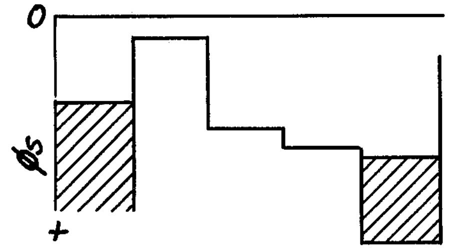
FIGS. 7B, 7C and 7D are diagrams of semiconductor surface potential versus distance along the semiconductor surface during the succeeding second subperiod of the first period, the first subperiod of the second period and the second subperiod of the second period, respectively, of the voltage waveform applied to the second electrode of the cell of FIG. 6A.
Figure 7C:
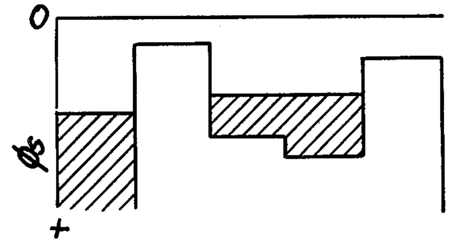
Figure 7D:
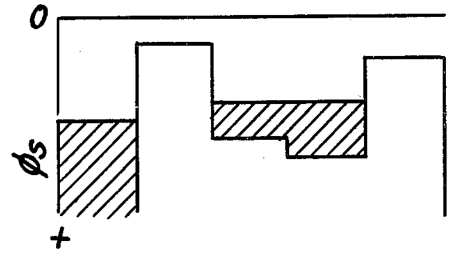

Consider the sequence of operation of a signal charge transfer device or cell, in particular cell 14, assuming that a pilot bit appears in the first stage of the scanner 20 and that a reference one bit in Manchester Code representation appears at the output terminal 24 as shown in FIG. 6K. The conditions existing in the charge transfer device 14 at the end of the subperiod $T_1$ of period $P_1$ is depicted in FIG. 7A. The pilot bit in the first stage of the scanner 20 raises the surface potential under the scan gate 43 and allows charge to flow from the region 41 into the first storage region 33 underlying electrode 36a and to equilibrate with the amplitude of the analog signal at that period of time. On termination of the pulse on the scan gate 43, a quantity of charge $Q_1$ is stored in the first storage region underlying the first storage electrode 36a which is proportional to the amplitude of the analog signal. As the line 36 and electrodes 36a are maintained at a fixed value during portions of the subperiods $T_1$ and $T_2$ of period $P_1$ by the application of the preset voltage $\phi_p$ of FIG. 6D, to preset the transistor 48 of the reset circuit 47, an accurate sampling of the analog signal is obtained. During the second subperiod $T_2$ of the first period $P_1$, the voltage on the second electrode 37 is raised as shown in FIG. 6K causing the charge in the first storage region of this cell to transfer to the second storage region of the cell. The condition at the end of the second subperiod $T_2$ of period $P_1$ is shown in FIG. 7B. During the first subperiod $T_1$ of the second period $P_2$ the voltage on the electrode 37 drops causing a lowering of the surface potential of the second storage region thereby causing charge in the second charge storage region to transfer back to the first storage region underlying electrode 36a. The condition at the end of the first subperiod of period $P_2$ is shown in FIG. 7C which is the same as the condition existing at the end of the first subperiod $T_1$ of period $P_1$. During the second subperiod $T_2$ of period $P_2$ the voltage appearing on the second electrode 37 remains low and accordingly the charge in the first storage region of the cell remains in this cell. The condition at the end of the second subperiod $T_2$ of period $P_2$ is shown in FIG. 7D. During portions of the first and second subperiods $T_1$ and $T_2$ of period $P_1$ the voltage on the output line is fixed by activation of the preset circuits 47. During the following period $P_2$, the preset circuit 47 is inactivated and the line 36 is allowed to float. As charge was transferred from the second storage region to the first storage region of cell 14 during the first subperiod of period $P_2$ and remained there during the second subperiod thereof, a change in voltage is produced on line 36 as shown in FIG. 6L. This change in voltage is applied to the output circuit 45, is sampled by application of the sample and hold waveform of FIG. 6M to the sample and hold switch 59 to produce at output terminal 61 of the output circuit a correlated output during the second subperiod $T_2$ of the second period $P_2$.

Figure 8A:
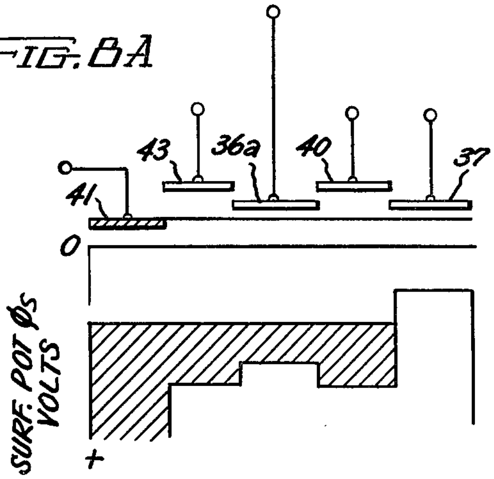
FIG. 8A shows a sectional view of a charge storage cell of the apparatus of FIG. 1 and also includes a diagram of semiconductor surface potential versus distance along the semiconductor surface during a first subperiod of a first period of a voltage waveform produced in response to a reference signal and applied to the second electrode of the cell.
Figure 8B:
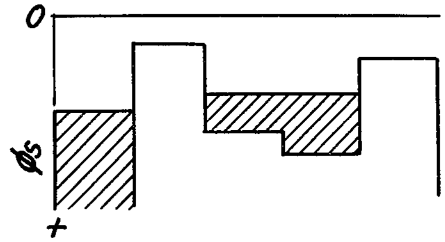
FIGS. 8B, 8C and 8D are diagrams of semiconductor surface potential versus distance along the semiconductor surface during the succeeding second subperiod of the first period, the first subperiod of the second period and the second subperiod of the second period of the voltage waveform applied to the second electrode of the cell.
Figure 8C:
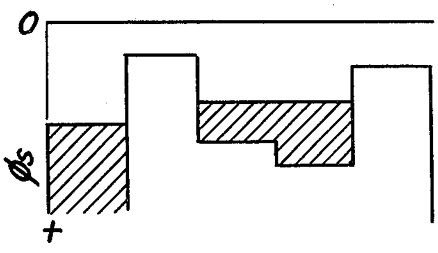
Figure 8D:
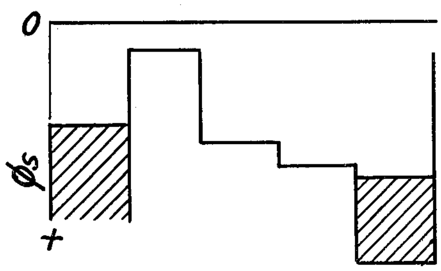

Now consider the sequence of operation of a single charge transfer device or cell, in particular cell 14, assuming that a reference zero bit is applied to the input terminal 23 of waveform generator 22 following the one bit described above and as shown in FIG. 6E. During the first and second subperiods $T_1$ and $T_2$ of period $P_3$, the voltage on the second electrode 37 is low, as shown in FIG. 6K, causing the charge in the first storage region underlying electrode 36a of this cell to remain in the first storage region of the cell. The condition at the end of the first and second subperiods $T_1$ and $T_2$ of period $P_3$ are shown in FIG. 8A and FIG. 8B, respectively. During the first subperiod $T_1$ of the fourth period $P_4$, the voltage appearing on the second electrode 37 remains low and accordingly the charge in the first storage region of the cell remains in this cell. The condition at the end of the first subperiod $T_1$ of period $P_4$ is shown in FIG. 8C. During the second subperiod $T_2$ of the fourth period $P_4$, the voltage on the electrode 37 rises causing a rise of the surface potential of the second storage region thereby causing the charge in the first storage region to transfer to the second storage region. The condition at the end of the second subperiod $T_2$ of period $P_4$ is shown in FIG. 8D. During portions of the first and second subperiods $T_1$ and $T_2$ of period $P_3$, the voltage on the output line is fixed by the activation of the preset circuit 47. During the following period $P_4$, the preset circuit is inactivated and the line 36 is allowed to float. As charge was transferred from the first storage to the second storage region of cell 14 during the second subperiod of period $P_4$, a change in voltage is produced on the line 36 as shown in FIG. 6L. This change in voltage applied to the output circuit 45 appears at output terminal 61 of output stage 45 after appropriate sampling by switch 59 on application of the sampling pulse of FIG. 6M during the second subperiod $T_2$ of the fourth period $P_4$.

Similar action takes place in each of the other devices of the apparatus. Accordingly, at each clock cycle a correlation output is obtained at the output terminal 61 of output amplifier 45. Mathematically the output $V_{out}$ at a particular time may be represented by the equation:

$$V_{out}=K\Sigma Q_n W_n,$$

where $Q_n$ is the charge stored in the $n^{th}$ cell; $W_n$ is the weight factor which may be equal to +1 if the code located in the $n^{th}$ stage of the reference shift register is derived from a logic "one" bit, and $W_n$ is equal to −1 if code located in the $n^{th}$ stage is derived from a logic "zero" bit; and K is a constant.

While the invention has been described in connection with transistors and charge transfer devices formed on P-type conductivity substrates, N-type conductivity substrates could as well be used. Of course, in such a case the applied potentials, diffusions and carrier types would be reversed in polarity. Preferably, the entire apparatus 10 shown in block diagram form in FIG. 1 is integrated on a common substrate. Preferably the circuits are formed on a epitaxial layer of high resistivity silicon semiconductor material grown on a lower resistivity silicon substrate.

While the invention has been described in a specific embodiment, it will be understood that modifications may be made by those skilled in the art, and it is intended by the appended claims to cover all such modifications and changes as fall within the true spirit and scope of the invention.

What is claimed is:

1. A waveform generator comprising:

a plurality of stages, each stage having an input terminal, a first output terminal and a second output terminal, the first output terminal of one stage being connected to the input terminal of a succeeding stage, each stage including first and second substages, each substage including first, second, third and fourth transistors, each transistor including a source, drain and a gate, first, second and third clocking lines, the source-drain conduction paths of the first, second and third transistors of the first and second substages of each stage being connected in series between said first clocking line and the second output terminal of said stage, the source-drain conduction path of said fourth transistor of each substage being connected in parallel with the source drain conduction path of said first transistor of said substage, the gate of the fourth transistor of the first substage of a first stage of said plurality of stages being connected to the input terminal of said first stage, an input terminal of said waveform generator being connected to said input terminal of said first stage, a first nodal capacitance being provided between the conductive junction of said first and second transistors of each substage and ground, a second nodal capacitance being provided between the conductive junction of said second and third transistors of each substage and ground, a third nodal capacitance being provided between said second output terminal of each stage and ground, the conductive junction of the second and third transistors of the first substage of each stage being connected to the gate of the fourth transistor of the second substage of said stage, the conductive junction of the second and third transistors of the second substage of each stage being connected to the first output terminal of said stage, said first clocking line being connected to the gate of the first transistor of each of said substages, said second clocking line being connected to the gates of the second and third transistors of the first substage of each of said stages, said third clocking line being connected to the gates of the second and third transistors of the second substage of each of said stages, means for applying a first clocking voltage between said first clocking line and ground, said first clocking voltage having a high level during a first subperiod of each period thereof and a low level during a second subperiod of each period thereof, means for applying a second clocking voltage between said second line and ground, said second clocking voltage having a high level during the first subperiod of a period of said first clocking voltage extending from the initiation of said high level and terminating during the second subperiod of said first period of said first clocking voltage, said second clocking voltage having a low level during the remainder of said second subperiod and during a succeeding second period of said first clocking voltage, means for applying a third clocking voltage between said third line and ground, said third clocking voltage having a high level during the first subperiod of a succeeding second period of said first clocking voltage extending from the initiation of said high level and terminating during the second subperiod of said second period of said first clocking voltage, said second clocking voltage having a low level during the remainder of said second subperiod of said second period and during a succeeding third period of said first clocking voltage, whereby when a high level of signal is applied to the input terminal of a stage during a first period of the first clocking voltage, an output signal is produced at the second output terminal of said stage which has a high level during the first subperiod of the first period of said first clocking voltage, a low level during the second subperiod of said first period and a high level during the succeeding second period of said first clocking voltage and when a low level of signal is applied to the input terminal of a stage during a first period and a succeeding second period of the first clocking voltage, an output signal is produced at the second output terminal of said stage which has a high level during the first period of said first clocking voltage, a high level during the first subperiod of the succeeding second period of said first clocking voltage and a low level during the second subperiod of the succeeding second period of said first clocking voltage.

2. The waveform generator of claim 1 including:

a plurality of inverters, each having an input terminal connected to the second output terminal of a respective one of said stages and an output terminal constituting the output terminal of said waveform generator.

3. The waveform generator of claim 2 in which each of said inverters is constituted of a plurality of transistors.

4. The waveform generator of claim 2 including:

means for providing a reference word having a series of successive elements, each of said elements having either a high level or a low level of a duration equal to two of said periods of said first clocking voltages, means for applying said reference word to the input terminal of said waveform generator, whereby a plurality of output voltage waveforms are produced, each at a respective output terminal of said waveform generator, the output voltage waveform produced at an output terminal of said waveform generator being identical to the voltage waveform produced at a preceding one of said output terminals except delayed by the duration of two periods of said first clocking voltage.

5. The waveform generator of claim 1 in which said transistors are formed on a common semiconductor substrate.

6. The waveform generator of claim 3 in which said transistors are formed on a common semiconductor substrate.

7. The waveform generator of claim 5 in which said first nodal capacitance is the capacitance of the drain of said first transistor and the source of said second transistor with respect to said substrate, said second nodal capacitance is the capacitance of the drain of said second transistor and the source of said third transistor with respect to said substrate, said third nodal capacitance is the capacitance of the drain of said third transistor of said first stage and the capacitance of said third transistor of said second substrage with respect to said substrate.

* * * * *